US012740163B2

(12) United States Patent
Yamazaki et al.

(10) Patent No.: US 12,740,163 B2
(45) Date of Patent: Sep. 15, 2026

(54) IMAGING DEVICE COMPRISING PIXEL CIRCUIT AND LIGHT-EMITTING DEVICE

(71) Applicant: Semiconductor Energy Laboratory Co., Ltd., Kanagawa-ken (JP)

(72) Inventors: Shunpei Yamazaki, Setagaya (JP); Satoshi Seo, Sagamihara (JP); Koji Kusunoki, Isehara (JP); Takayuki Ikeda, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 773 days.

(21) Appl. No.: 17/273,032

(22) PCT Filed: Aug. 26, 2019

(86) PCT No.: PCT/IB2019/057137
§ 371 (c)(1),
(2) Date: Mar. 3, 2021

(87) PCT Pub. No.: WO2020/049398
PCT Pub. Date: Mar. 12, 2020

(65) Prior Publication Data

US 2021/0351224 A1 Nov. 11, 2021

(30) Foreign Application Priority Data

Sep. 7, 2018 (JP) ................................ 2018-167669

(51) Int. Cl.
*H10F 39/12* (2025.01)
*H10D 30/67* (2025.01)
(Continued)

(52) U.S. Cl.
CPC ..... *H10F 39/198* (2025.01); *H10F 39/80377* (2025.01); *H10D 30/6755* (2025.01);
(Continued)

(58) Field of Classification Search
CPC ......... H01L 27/14678; H01L 27/14616; H01L 27/1225; H01L 27/1255; H01L 29/24;
(Continued)

(56) References Cited

U.S. PATENT DOCUMENTS 6,724,012 B2 4/2004 Kimura
7,280,144 B2 10/2007 Kakumoto et al.
(Continued)

FOREIGN PATENT DOCUMENTS

CN 107040731 A 8/2017
JP 2002-268615 A 9/2002
(Continued)

OTHER PUBLICATIONS

International Search Report (Application No. PCT/IB2019/057137), dated Nov. 26, 2019.
(Continued)

*Primary Examiner* — Brian Turner
*Assistant Examiner* — Zhijun Xu
(74) *Attorney, Agent, or Firm* — Husch Blackwell LLP

(57) ABSTRACT

A thin imaging device including a light source is provided. The imaging device includes a light-emitting device which emits infrared light. Infrared light emitted by the light-emitting device and reflected by a subject is received by a photoelectric conversion device included in a pixel circuit. Since an EL element is used as the light-emitting device, a thin imaging device with a light source can be formed. A pixel circuit utilizing an oxide semiconductor transistor having a property of low off-state current is used, whereby image capturing by a global shutter method is possible and a distortion-free image can be obtained even when the subject is moving.

18 Claims, 14 Drawing Sheets

(51) Int. Cl.
*H10D 62/80* (2025.01)
*H10D 86/40* (2025.01)
*H10D 86/60* (2025.01)
*H10F 39/00* (2025.01)

(52) U.S. Cl.
CPC ........... *H10D 62/80* (2025.01); *H10D 86/423* (2025.01); *H10D 86/481* (2025.01); *H10D 86/60* (2025.01)

(58) Field of Classification Search
CPC ............... H01L 29/7869; H01L 25/167; H01L 27/14636; H01L 27/14612; H01L 27/15; H04N 25/70; H04N 25/77; H10F 39/198; H10F 39/80377; H10F 39/8037; H10F 39/811; H10D 30/6755; H10D 62/80; H10D 86/423; H10D 86/481; H10D 86/60; H10W 90/00; H10H 29/10
See application file for complete search history.

(56) References Cited

U.S. PATENT DOCUMENTS 8,378,391 B2 2/2013 Koyama et al.
8,399,821 B2 3/2013 Matsumoto
8,916,869 B2 12/2014 Koyama et al.
9,123,672 B2 9/2015 Kimura
9,155,498 B2 10/2015 Akiyama
9,167,994 B2 10/2015 Akiyama
9,331,112 B2 5/2016 Koyama et al.
9,379,138 B2 6/2016 Ikeda et al.
9,773,814 B2 9/2017 Koyama et al.
9,817,520 B2 11/2017 Ikeda et al.
9,841,843 B2 12/2017 Kurokawa et al.
10,896,923 B2 1/2021 Ohmaru et al.
10,917,597 B2 2/2021 Ohmaru et al.
2002/0074551 A1 6/2002 Kimura
2004/0233304 A1* 11/2004 Kakumoto .......... H04N 3/1568 348/241
2010/0155578 A1* 6/2010 Matsumoto ....... H01L 27/14678 250/216
2011/0108836 A1* 5/2011 Koyama ................ H10D 86/40 257/E29.095
2012/0154337 A1* 6/2012 Kurokawa ............ G06F 3/0412 257/E31.095
2014/0340363 A1* 11/2014 Ikeda .................. G06F 3/04164 345/175
2015/0021598 A1 1/2015 Ikeda et al.
2015/0301383 A1 10/2015 Kimura
2015/0364527 A1* 12/2015 Wang .................... H10K 59/40 257/40
2017/0013214 A1 1/2017 Ohmaru
2017/0069672 A1* 3/2017 Jin .......................... H10F 39/18
2019/0340409 A1* 11/2019 Zhu ........................ H10K 59/40
2021/0051291 A1 2/2021 Ohmaru et al.

FOREIGN PATENT DOCUMENTS

JP 2004-349907 A 12/2004
JP 2007-081203 A 3/2007
JP 2010-153449 A 7/2010
JP 2011-119711 A 6/2011
JP 2012-256020 A 12/2012
JP 2013-073965 A 4/2013
JP 2015-005280 A 1/2015
JP 2015-039165 A 2/2015
KR 2012-0067292 A 6/2012
TW 201246039 11/2012
WO WO 2011/055626 A1 5/2011

OTHER PUBLICATIONS

Written Opinion (Application No. PCT/IB2019/057137), dated Nov. 26, 2019.
Chinese Office Action (Application No. 201980056722.X) Dated May 17, 2025.

* cited by examiner 132
122
130
101
104
127
126
105
FD
11
103
106
108
128
129

132
122
101
104
127
126
105
FD
11
103
106
108
128
129

132
122
127
101
104
107
126
105
FD
11
103
106
108
128
129

132
122
101
127
104
126
109
FD
105
11
103
108
106
128
129

132
122
101
104
127
126
131
107
FD
105
11
103
108
106
128
129

132
122
130
127
101
104
126
107
FD
105
11
103
108
106
128
129

T1
T2
T3
T4
126
127
FD
128
129

T1
T2
T3
T4
126
127
FD
128
129

562
563
561
564
11
101

101
565b
565a 101
566d
566c
566b
566a 11
312
330
300
320
340
311

FIG. 12A
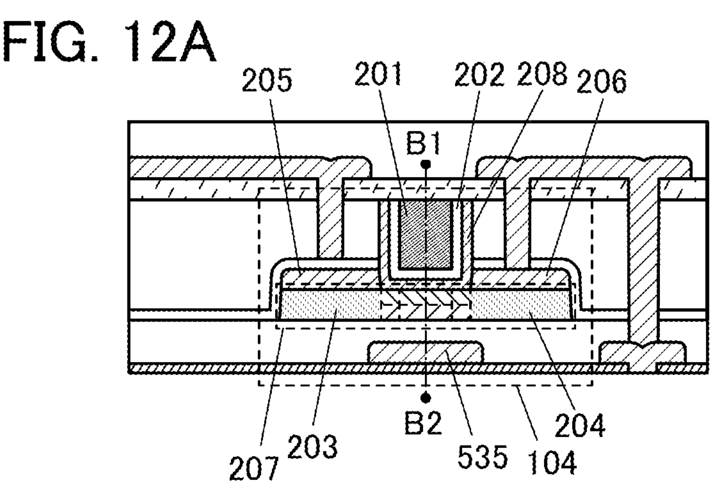
FIG. 12B
201
202
203
535
104
204
FIG. 12C
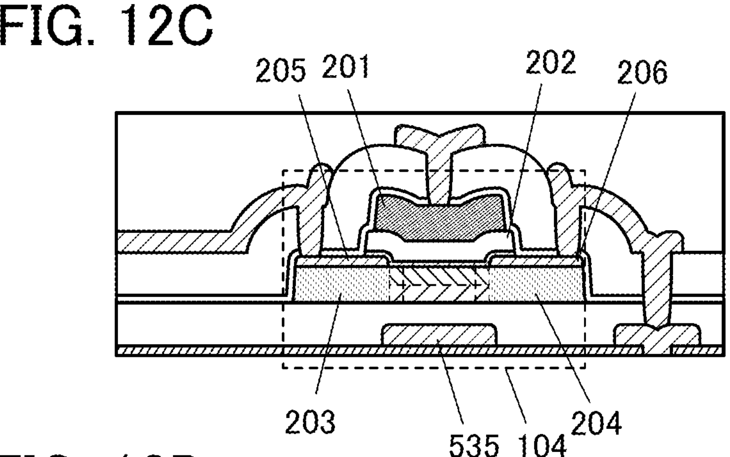
FIG. 12D
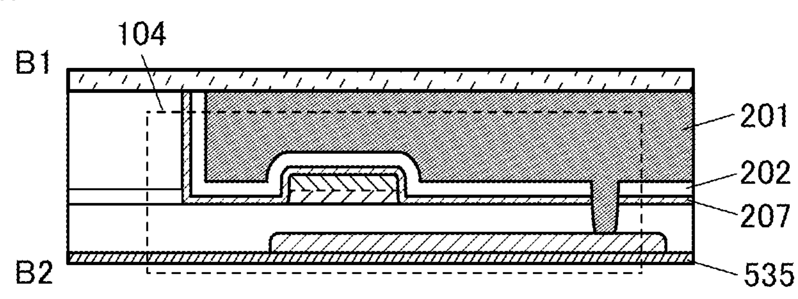

IMAGING DEVICE COMPRISING PIXEL CIRCUIT AND LIGHT-EMITTING DEVICE

This application is a 371 of international application PCT/IB2019/057137 filed on Aug. 26, 2019 which is incorporated herein by reference.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification and the like include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device means a general device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

REFERENCE

Patent Document

[Patent Document 1] Japanese Published Patent Application No. 2011-119711

SUMMARY OF THE INVENTION

Problems to be Solved by the Invention

An imaging device is used not only as a means for producing an image from visible light but also for various purposes. For example, imaging devices are used for personal authentication, failure analysis, medical diagnosis, security purposes, and the like. For these purposes, short-wavelength light such as X rays, long-wavelength light such as infrared rays, and the like, as well as visible light are used in accordance with the purpose.

As the visible light and the infrared rays, natural light or a room light is used in some cases. In addition, a dedicated light source is commonly used as well. Although a light bulb type lamp, an LED, or the like is often used as the light source, they have difficulty in miniaturization and thinning when they are combined with imaging devices.

In view of the above, an object of one embodiment of the present invention is to provide an imaging device including a light source. Another object is to provide an imaging device including a thin light source. Another object is to provide an imaging device which includes a thin light source and captures an image from light that is emitted from the light source and reflected by a subject. Another object is to provide an imaging device including a thin infrared light source.

Another object is to provide an imaging device with low power consumption. Another object is to provide an imaging device capable of capturing an image at high speed. Another object is to provide a highly reliable imaging device. Another object is to provide a novel imaging device. Another object is to provide a method for operating the above-described imaging device. Another object is to provide a novel semiconductor device or the like.

Note that the descriptions of these objects do not preclude the existence of other objects. One embodiment of the present invention does not have to achieve all of these objects. Other objects are apparent from and can be derived from the descriptions of the specification, the drawings, the claims, and the like.

Means for Solving the Problems

One embodiment of the present invention relates to a thin imaging device including a light source.

One embodiment of the present invention is an imaging device including a first layer and a second layer, in which the first layer and the second layer include an overlap region, in which the first layer includes a pixel circuit, the second layer includes a light-emitting device, in which the pixel circuit includes a photoelectric conversion device and a transistor, in which the light-emitting device includes a first electrode, a second electrode, and a light-emitting layer, in which the light-emitting layer is provided between the first electrode and the second electrode, and in which the photoelectric conversion device includes a region which does not overlap with the first electrode.

Another embodiment of one embodiment of the present invention is an imaging device including a first layer and a second layer, in which the first layer and the second layer include an overlap region, in which the first layer includes a pixel circuit, in which the second layer includes a light-emitting device, in which the light-emitting device includes a first electrode, a second electrode, and a light-emitting layer, in which the light-emitting layer is provided between the first electrode and the second electrode, in which the pixel circuit includes a photoelectric conversion device, a first transistor, a second transistor, a third transistor, a fourth transistor, and a capacitor, in which one electrode of the photoelectric conversion device is electrically connected to one of a source and a drain of the first transistor, in which the other of the source and the drain of the first transistor is electrically connected to one of a source and a drain of the second transistor, in which the one of the source and the drain of the second transistor is electrically connected to one electrode of the capacitor, in which the one electrode of the capacitor is electrically connected to a gate of the third transistor, in which one of a source and a drain of the third transistor is electrically connected to one of a source and a drain of the fourth transistor, and in which the photoelectric conversion device includes a region which does not overlap with the first electrode.

The photoelectric conversion device may include a region overlapping with the second electrode and the light-emitting layer.

As the light-emitting device, an element which emits infrared light can be used. As the second electrode, a light-transmitting conductive film having a property of transmitting infrared light is preferably used.

The other of the source and the drain of the second transistor can be electrically connected to the other of the source and the drain of the third transistor, and the other of the source and the drain of the third transistor can be electrically connected to one electrode of the light-emitting device.

As a structure different from the above, the other electrode of the photoelectric conversion device may be electrically connected to the other of the source and the drain of the third transistor, and the other of the source and the drain of the third transistor may be electrically connected to one electrode of the light-emitting device.

In the above-described two structures, a fifth transistor may be further included, in which case one of a source and a drain of the fifth transistor is electrically connected to one electrode of the light-emitting device, and the other of the source and the drain of the fifth transistor is electrically connected to the other of the source and the drain of the third transistor.

At least one or more of transistors included in the imaging device preferably includes a metal oxide in its channel formation region, and the metal oxide preferably includes In, Zn, and M (M is Al, Ti, Ga, Sn, Y, Zr, La, Ce, Nd, or Hf).

Effect of the Invention

With one embodiment of the present invention, an imaging device including a light source can be provided. Alternatively, an imaging device including a thin light source can be provided. Alternatively, an imaging device which includes a thin light source and captures an image from light that is emitted from the light source and reflected by a subject can be provided. Alternatively, an imaging device including a thin infrared light source can be provided. Alternatively, an imaging device with low power consumption can be provided.

Alternatively, an imaging device capable of capturing an image at high speed can be provided. Alternatively, a highly reliable imaging device can be provided. Alternatively, a novel imaging device can be provided. Alternatively, a method for operating the above-described imaging device can be provided. Alternatively, a novel semiconductor device or the like can be provided.

BRIEF DESCRIPTION OF THE DRAWINGS

FIG. 12A, FIG. 12B, FIG. 12C, and FIG. 12D are views illustrating transistors.

MODE FOR CARRYING OUT THE INVENTION

Figure 1:
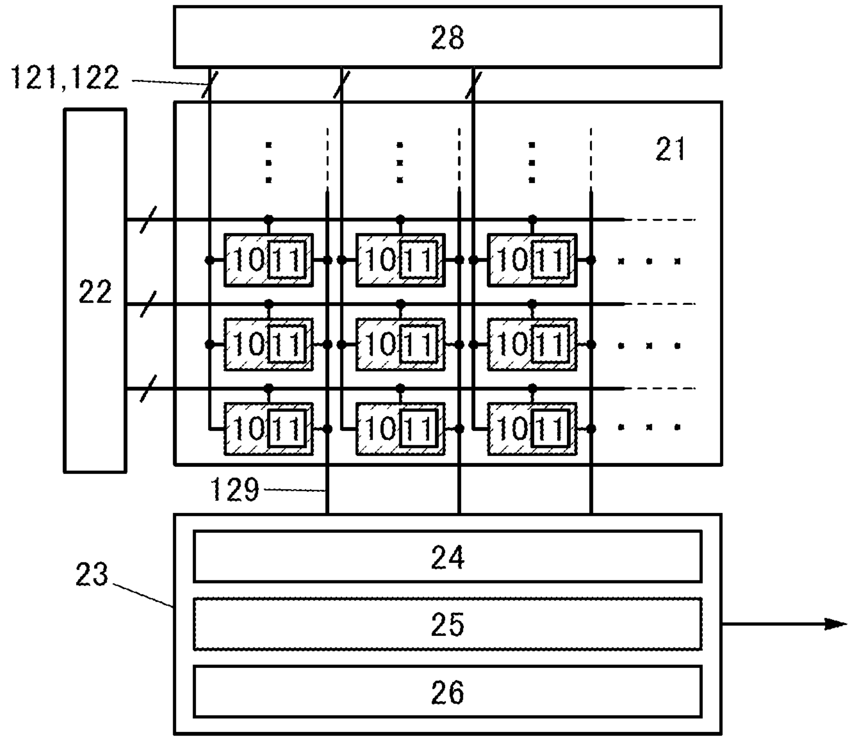
FIG. 1 is a block diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of the embodiments described below. Note that in structures of the invention described below, the same portions or portions having similar functions are denoted by the same reference numerals in different drawings, and the descriptions thereof are not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch may be connected in series or in parallel. In some cases, a capacitor (also referred to as a capacitive element) may be divided and the divided parts may be placed in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through a plurality of conductors; in this specification, even such a structure is included in direct connection.

Embodiment 1

In this embodiment, an imaging device of one embodiment of the present invention is described with reference to drawings.

One embodiment of the present invention is an imaging device including a light-emitting device (also referred to as a light-emitting element). Light is emitted from the light-emitting device to a subject and light reflected by the subject is received by a photoelectric conversion device (also referred to as photoelectric conversion element) included in a pixel circuit. Since an EL element is used as the light-emitting device, a thin imaging device with a light source can be formed.

When an element that emits infrared light is used as the light-emitting device, the imaging device can be used for the purposes of biometric authentication, failure analysis of industrial products, and the like. Furthermore, employing a pixel circuit that is easy to use for image capturing by a global shutter method enables a distortion-free image to be obtained even when the subject is moving.

FIG. 1 is a block diagram illustrating an imaging device of one embodiment of the present invention. The imaging device includes a pixel array 21 including pixel circuits 10 arranged in a matrix, a circuit 22 having a function of selecting a row of the pixel array 21 (row driver), a circuit 23 having a function of reading out data from the pixel circuits 10, and a circuit 28 which supplies a power supply potential. Light-emitting devices 11 are stacked over the pixel circuits 10.

The circuit 23 can include a circuit 24 having a function of selecting a column of the pixel array 21 (column driver), a circuit 25 for performing correlated double sampling processing on output data from the pixel circuits 10 (CDS circuit), a circuit 26 having a function of converting analog data output from the circuit 25 into digital data (A/D converter circuit or the like), and the like.

Figure 2A:
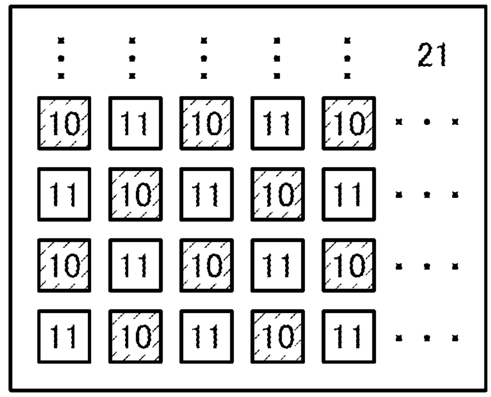
FIG. 2A, FIG. 2B, and FIG. 2C are views illustrating pixel arrays.
Figure 2B:
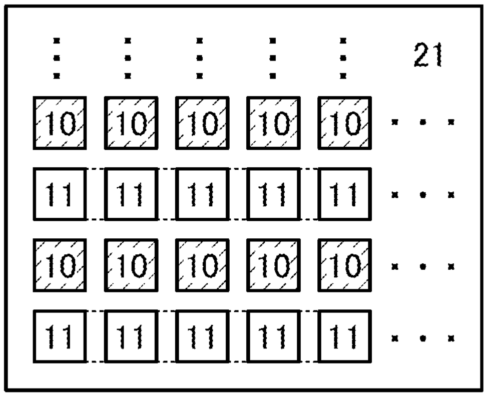

Note that in the case where the resolution is not focused, a structure in which the pixel circuits 10 and the light-emitting devices 11 do not overlap with each other may be employed. For example, as illustrated in FIG. 2A, the pixel circuits 10 and the light-emitting devices 11 may be alternately arranged at regular intervals. As illustrated in FIG. 2B, the pixel circuits 10 and the light-emitting devices 11 may be alternately arranged row by row. Note that the pixel circuits 10 and the light-emitting devices 11 may be alternately arranged column by column.

Figure 2C:
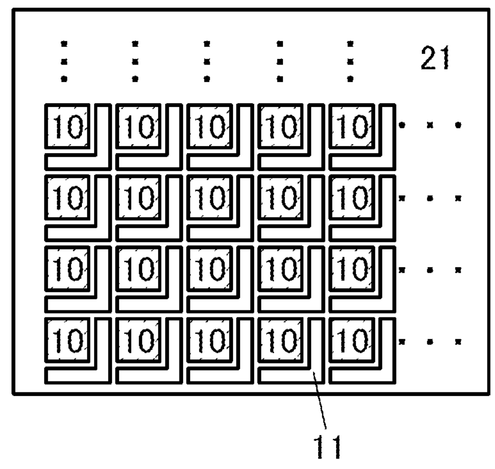

As illustrated in FIG. 2C, a structure in which the light-emitting device 11 is provided between two adjacent pixel circuits 10 may be employed. In this case, the light-emitting device 11 is provided so as to include a region overlapping with a wiring connected to the pixel circuit 10. Therefore, it can also be said in a broad sense that the pixel circuit 10 and the light-emitting device 11 overlap with each other. Note that although the same number of light-emitting devices 11 as the number of pixel circuits 10 are illustrated in FIG. 2C, the number of light-emitting devices 11 may be different from that of pixel circuits 10.

Figure 3A:
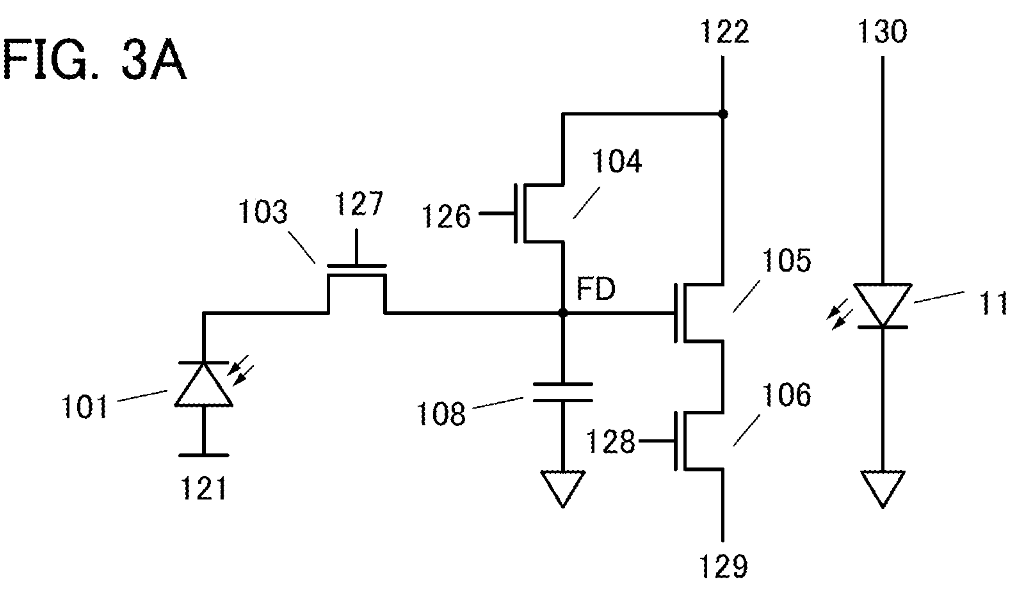
FIG. 3A, FIG. 3B, and FIG. 3C are views illustrating pixel circuits.

FIG. 3A is a circuit diagram illustrating the pixel circuit 10 and the light-emitting device 11 that can be used for the imaging device of one embodiment of the present invention. The pixel circuit 10 can include a photoelectric conversion device 101, a transistor 103, a transistor 104, a transistor 105, a transistor 106, and a capacitor 108. Note that a structure in which the capacitor 108 is not provided may be employed as well.

One electrode (cathode) of the photoelectric conversion device 101 is electrically connected to one of a source and a drain of the transistor 103. The other of the source and the drain of the transistor 103 is electrically connected to one of a source and a drain of the transistor 104. The one of the source and the drain of the transistor 104 is electrically connected to one electrode of the capacitor 108. One electrode of the capacitor 108 is electrically connected to a gate of the transistor 105. One of a source and a drain of the transistor 105 is electrically connected to one of a source and a drain of the transistor 106.

Here, a wiring that connects the other of the source and the drain of the transistor 103, the one electrode of the capacitor 108, and the gate of the transistor 105 is a node FD. The node FD can function as a charge accumulation portion.

The other electrode (anode) of the photoelectric conversion device 101 is electrically connected to a wiring 121. A gate of the transistor 103 is electrically connected to a wiring 127. The other of the source and the drain of the transistor 104 and the other of the source and the drain of the transistor 105 are electrically connected to a wiring 122. A gate of the transistor 104 is electrically connected to a wiring 126. A gate of the transistor 106 is electrically connected to a wiring 128. The other electrode of the capacitor 108 is electrically connected to a reference potential line such as a GND wiring, for example. The other of the source and the drain of the transistor 106 is electrically connected to a wiring 129.

In FIG. 3A, one electrode of the light-emitting device 11 is electrically connected to a wiring 130. The other electrode of the light-emitting device 11 is electrically connected to a reference potential line such as a GND wiring, for example. Since the pixel circuit 10 and the light-emitting device 11 are not electrically connected in this structure, the input potential to the light-emitting device 11 and the timing of light emission can be controlled independently.

The wirings 127 and 128 can function as signal lines which control the electrical conduction of the respective transistors. The wiring 129 can function as an output line.

The wirings 121, 122, and 130 can have functions of power supply lines. The structure illustrated in FIG. 3A is a structure in which the cathode side of the photoelectric conversion device 101 is electrically connected to the transistor 103 and the node FD is reset to a high potential in the operation; accordingly, the wiring 122 is set to a high potential (a potential higher than that of the wiring 121). The wiring 130 has a function of supplying a potential for supplying a forward bias to the light-emitting device 11 and causing light emission.

Figure 3B:
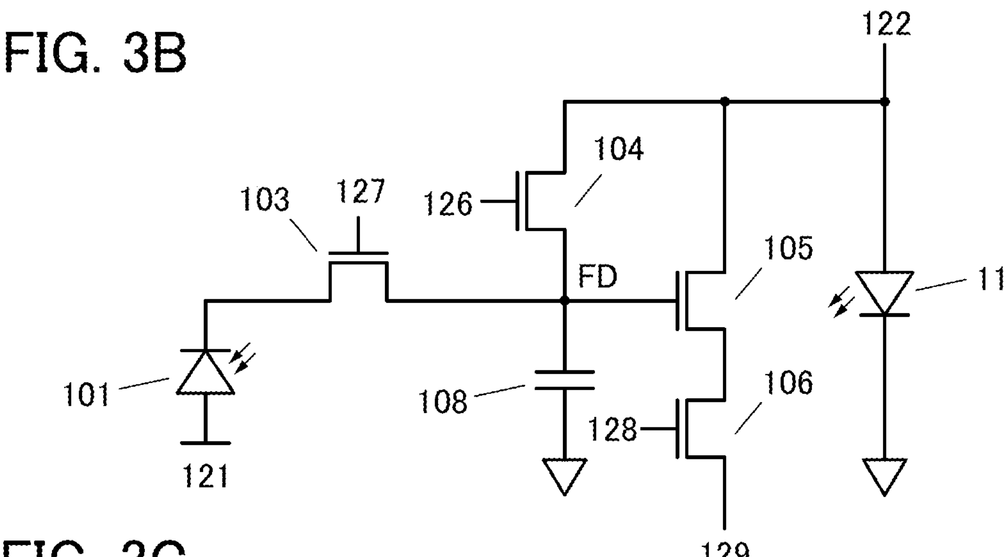

FIG. 3B illustrates a structure in which the one electrode of the light-emitting device 11 is electrically connected to the wiring 122. This structure can be employed in the case where a common potential can be used as the reset potential of the node FD, the power supply potential supplied to the transistor 105, and the input potential to the light-emitting device 11.

Figure 3C:
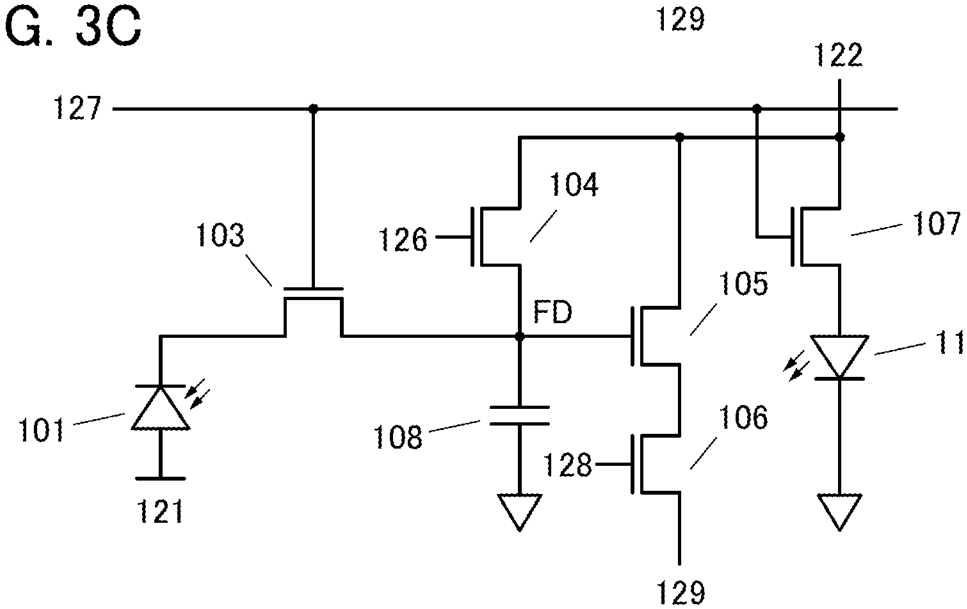

As illustrated in FIG. 3C, the transistor 107 may be added to the structure of FIG. 3B. One of a source and a drain of the transistor 107 is electrically connected to the one electrode of the light-emitting device 11. The other of the source and the drain of the transistor 107 is electrically connected to the wiring 122. A gate of the transistor 107 is electrically connected to the wiring 127. With this structure, the light emission period can be limited to only a period during which the transistor 103 is on, whereby the power consumption can be reduced. Since the transistor 103 needs to be on only in a reset operation period and an accumulation operation period for the node FD, nonessential light emission in a reading operation period or the like can be suppressed.

Figure 4A:
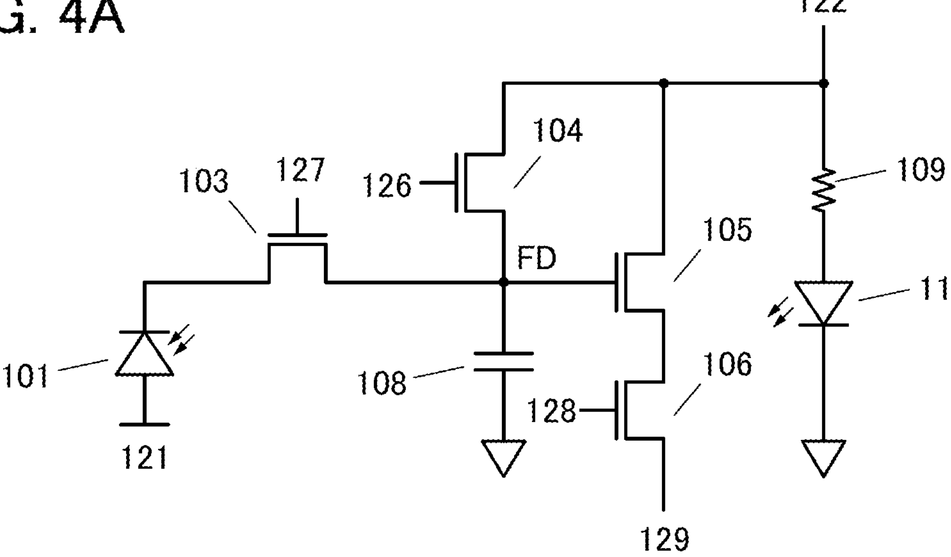
FIG. 4A, FIG. 4B, and FIG. 4C are views illustrating pixel circuits.

Furthermore, in the case where the reset potential of the node FD or the like is too high compared with an appropriate potential input to the light-emitting device 11, a resistor 109 may be electrically connected between the one electrode of the light-emitting device 11 and the wiring 122 as illustrated in FIG. 4A. The resistor 109 operates as a current-limiting resistance; limiting the current flowing through the light-emitting device 11 can enhance the reliability of the light-emitting device 11. The resistance value of the resistor 109 may be selected so as to be suitable for electrical characteristics of the light-emitting device 11.

Figure 4B:
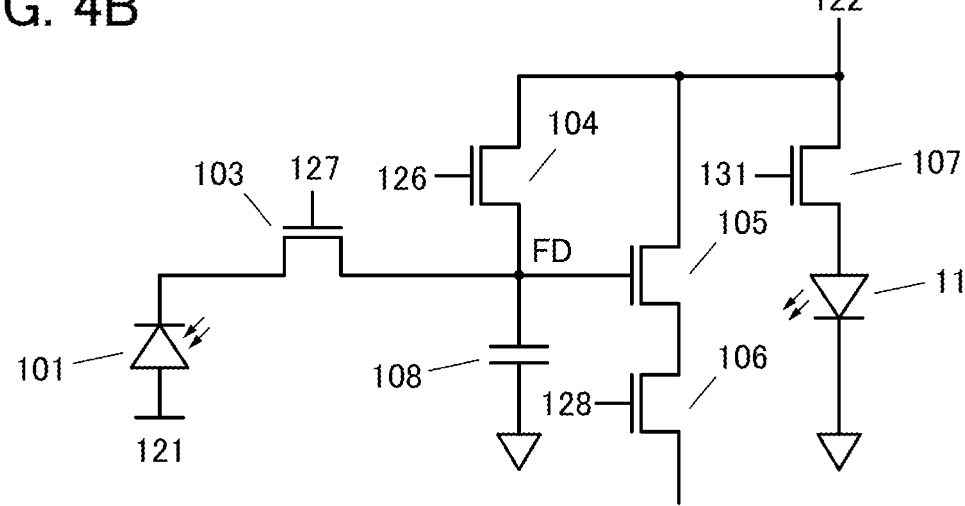

Note that as illustrated in FIG. 4B, the transistor 107 illustrated in FIG. 3C may operate as a substitute for the resistor 109. In this structure, the gate of the transistor 107 is electrically connected to a wiring 131. Thus, changing the potential of the wiring 131 allows appropriate control of the illuminance of the light-emitting device 11 and the timing of light emission, so that power consumption can be suppressed.

Figure 4C:
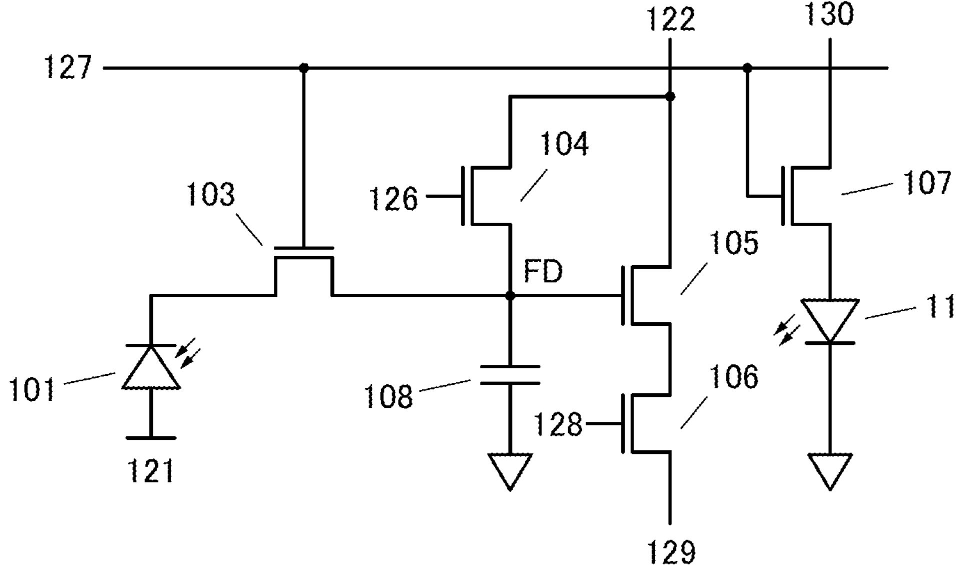
Figure 5A:
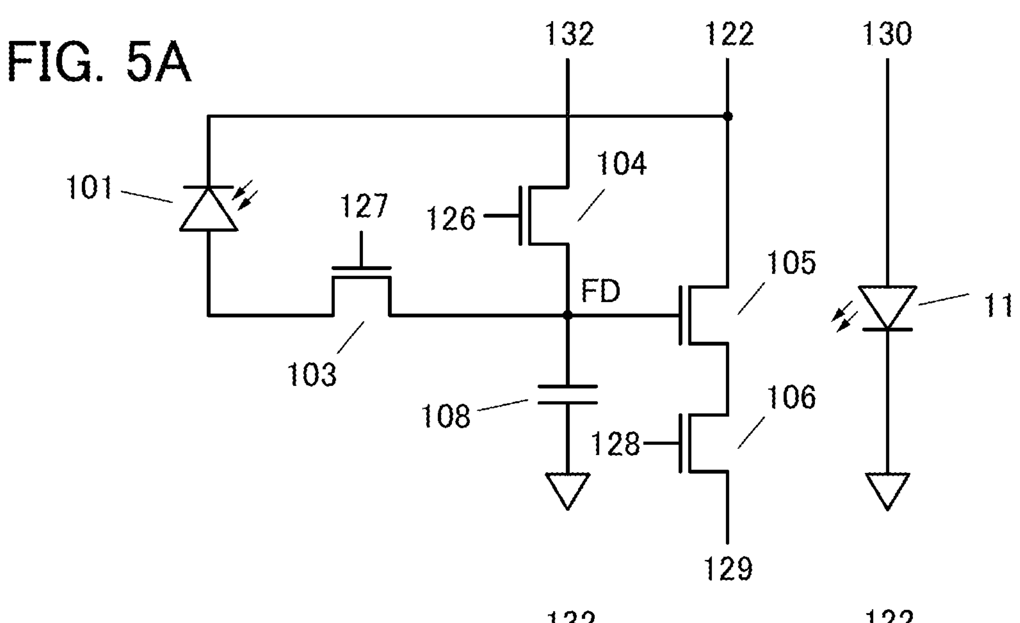
FIG. 5A, FIG. 5B, and FIG. 5C are views illustrating pixel circuits.
Figure 5B:
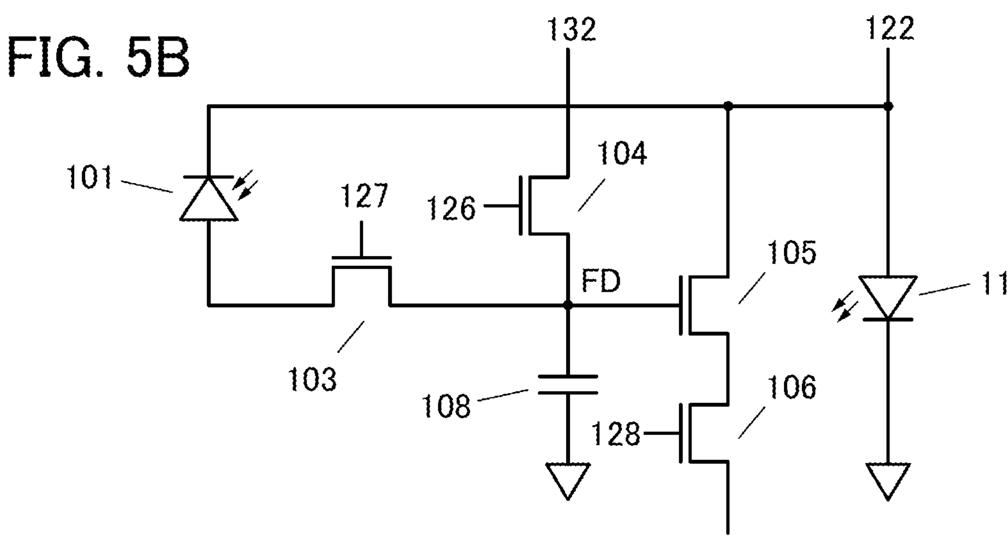
Figure 5C:
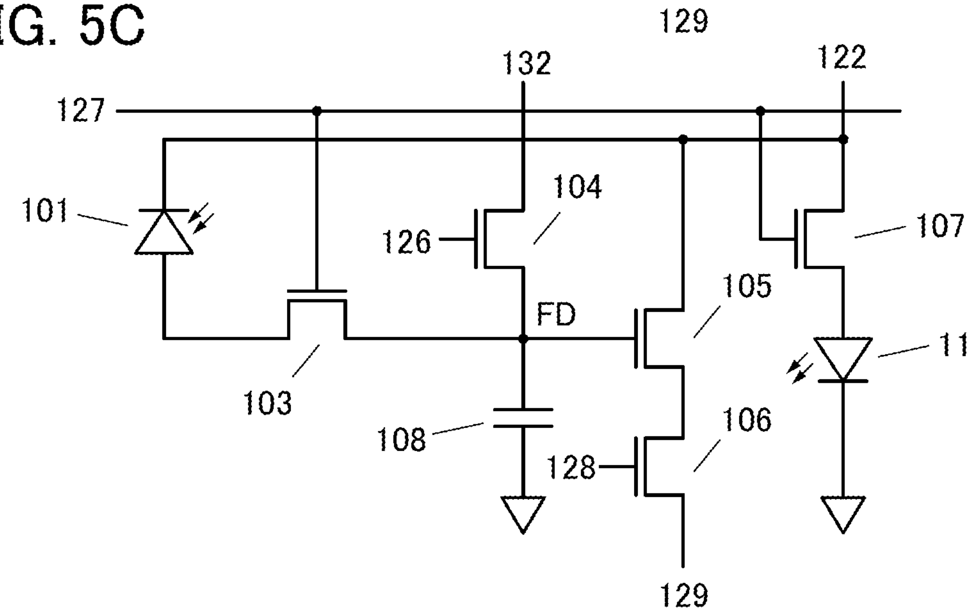
Figures 6A, 6B, 6C:
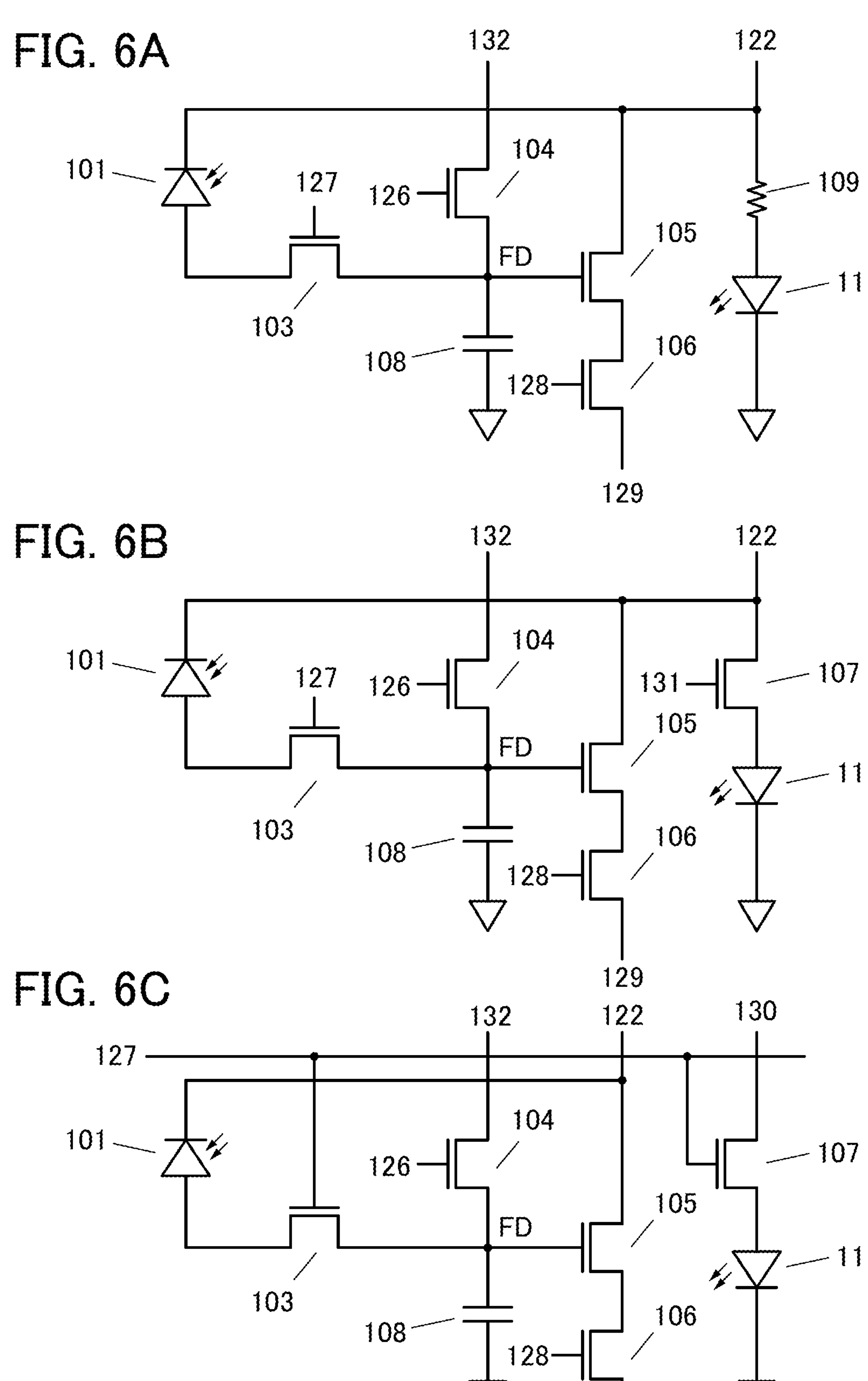
FIG. 6A, FIG. 6B, and FIG. 6C are views illustrating pixel circuits.

Furthermore, as illustrated in FIG. 4C, with the transistor 107 provided, the other of the source and the drain of the transistor 107 may be electrically connected to the wiring 130, and the gate of the transistor 107 may be electrically connected to the wiring 127. In this structure, the input potential to the light-emitting device 11 is controlled by the wiring 130, and the timing of light emission is controlled by the wiring 127.

Note that FIG. 3A to FIG. 3C and FIG. 4A to FIG. 4C show the structures in which the cathode of the photoelectric conversion device 101 is electrically connected to the node FD. However, as illustrated in FIG. 5A to FIG. 5C and FIG. 6A to FIG. 6C, the anode of the photoelectric conversion device 101 may be electrically connected to the node FD.

In the structures illustrated in FIG. 5A to FIG. 5C and FIG. 6A to FIG. 6C, the one electrode of the photoelectric conversion device 101 is electrically connected to the wiring 122 and the other electrode of the photoelectric conversion device 101 is electrically connected to the one of the source and the drain of the transistor 103. In addition, the other of the source and the drain of the transistor 104 is electrically connected to a wiring 132.

The wiring 132 can have a function of a power supply line or a supply line of a reset potential. The structures illustrated in FIG. 5A to FIG. 5C and FIG. 6A to FIG. 6C are structures in which the anode side of the photoelectric conversion device 101 is electrically connected to the transistor 103 and the node FD is reset to a low potential in the operation; accordingly, the wiring 132 is set to a low potential (a potential lower than that of the wiring 122).

For the connection between the light-emitting device 11 and the peripheral components illustrated in FIG. 5A to FIG. 5C and FIG. 6A to FIG. 6C, the descriptions for FIG. 3A to FIG. 3C and FIG. 4A to FIG. 4C can be referred to.

As the photoelectric conversion device 101, a photodiode can be used. In one embodiment of the present invention, image capturing using infrared rays is performed. Therefore, a photodiode which can convert light in the infrared region into electricity is used as the photoelectric conversion device 101. For example, a pn junction photodiode in which single crystal silicon is used in a photoelectric conversion portion, a pin photodiode in which polycrystalline silicon or microcrystalline silicon is used in a photoelectric conversion layer, or the like can be used. Alternatively, a material that can convert light in the infrared region into electricity, such as a compound semiconductor, can be used as well.

The transistor 103 has a function of controlling the potential of the node FD. The transistor 104 has a function of resetting the potential of the node FD. The transistor 105 functions as a source follower circuit, and can output the potential of the node FD as image data to the wiring 129. The transistor 106 has a function of selecting a pixel to which the image data is output.

Transistors using a metal oxide in their channel formation regions (hereinafter, OS transistors) are preferably used as at least the transistor 103 and the transistor 104. The OS transistors have a feature of an extremely low off-state current. When OS transistors are used as the transistors 103 and 104, a period during which charge can be retained at the node FD can be elongated greatly. Therefore, a global shutter method by which charge accumulation operation is performed in all the pixels at the same time can be used without complicating the circuit structure and operation method.

Figure 7A:
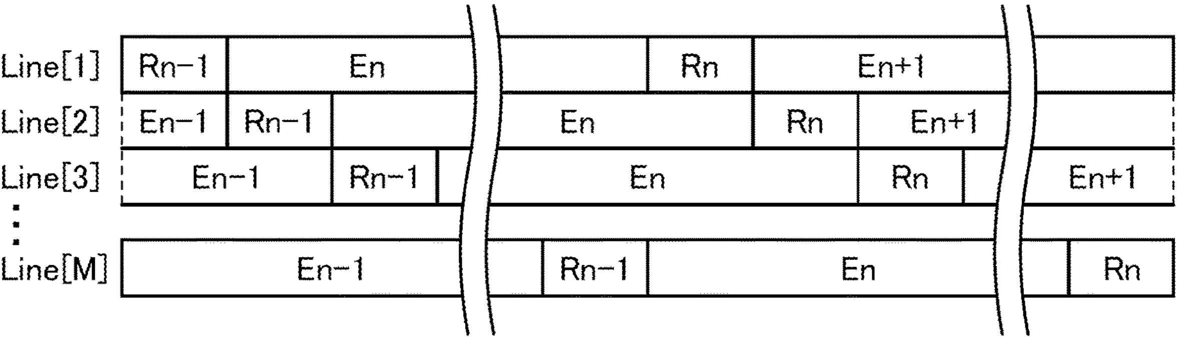
FIG. 7A is a view illustrating a rolling shutter method.
Figure 7B:
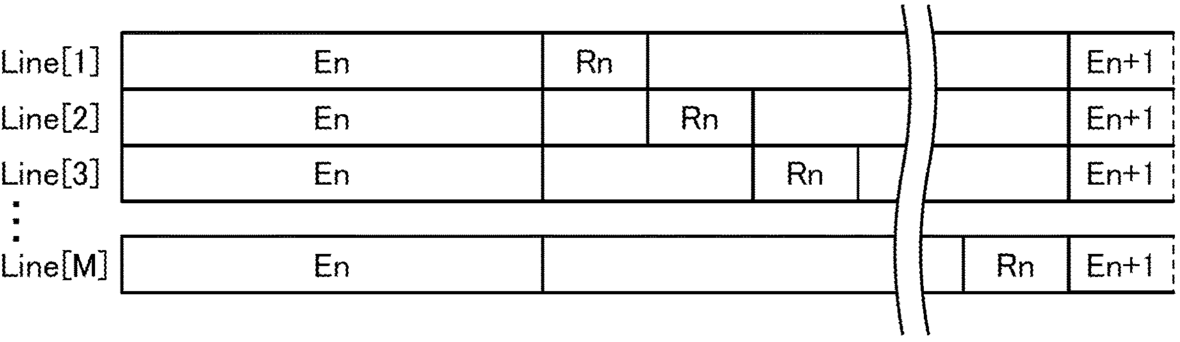
FIG. 7B is a view illustrating a global shutter method.

FIG. 7A is a schematic view of the operation method with a rolling shutter method, and FIG. 7B is a schematic view of a global shutter method. En denotes exposure (accumulation operation) in the n-th column (n is a natural number), and Rn denotes reading operation in the n-th column. FIG. 7A and FIG. 7B show the operations from the first row to the M-th row (M is a natural number).

The rolling shutter method is an operation method in which the exposure and data reading are performed sequentially and a reading period of a row overlaps with an exposure period of another row. The reading operation is performed right after the exposure, so that image capturing can be performed even with a circuit structure having a relatively short data retention period. However, an image of one frame is formed with data that do not have simultaneity of image capturing, and thus image distortion is generated in the captured image of a moving object.

In contrast, the global shutter method is an operation method in which exposure is performed on all the pixels at the same time, data is retained in each pixel, and data reading is performed row by row. Thus, a distortion-free image can be obtained even in image capturing for a moving object.

In the case where a transistor having a relatively high off-state current, such as a transistor that uses Si in its channel formation region (hereinafter, Si transistor), is used in a pixel circuit, a data potential is likely to outflow from a charge accumulation portion; therefore, a rolling shutter method is used. To perform a global shutter method with a Si transistor, a memory circuit or the like needs to be provided additionally, and a more complex operation needs to be performed at high speed. On the other hand, in the case of using an OS transistor in a pixel circuit, the outflow of a data potential from a charge accumulation portion hardly occurs and thus a global shutter method can easily be performed.

Note that OS transistors may also be used as the transistors 105 and 106. Furthermore, an OS transistor and a Si transistor may be used in appropriate combination. Furthermore, all the transistors may be either OS transistors or Si transistors. Examples of the Si transistor include a transistor containing amorphous silicon and a transistor containing crystalline silicon (typically, low-temperature polysilicon, single crystal silicon, or the like).

An EL element can be used as the light-emitting device 11. As the EL element, an element that emits infrared light can be used. In particular, the EL element preferably emits near-infrared light having a peak at a wavelength higher than or equal to 700 nm and lower than or equal to 2500 nm. For example, light having a wavelength of 760 nm and its vicinity is easily absorbed by hemoglobin in the vein, so that the position of the vein can be detected by making an image from received reflected light or the like from a palm, a finger, or the like. This operation can be utilized for biometric authentication. Moreover, with the use of near-infrared light having an appropriate wavelength, the operation can also be utilized for non-destructive testing such as foreign body inspection of foods or failure analysis of industrial products. Furthermore, in combination with a global shutter method, highly accurate sensing is possible even when the subject is moving.

When an EL element is used as the light-emitting device 11, a thin imaging device with a light source can be achieved. The imaging device can easily be incorporated in various devices and the portability can be improved.

Figure 8A:
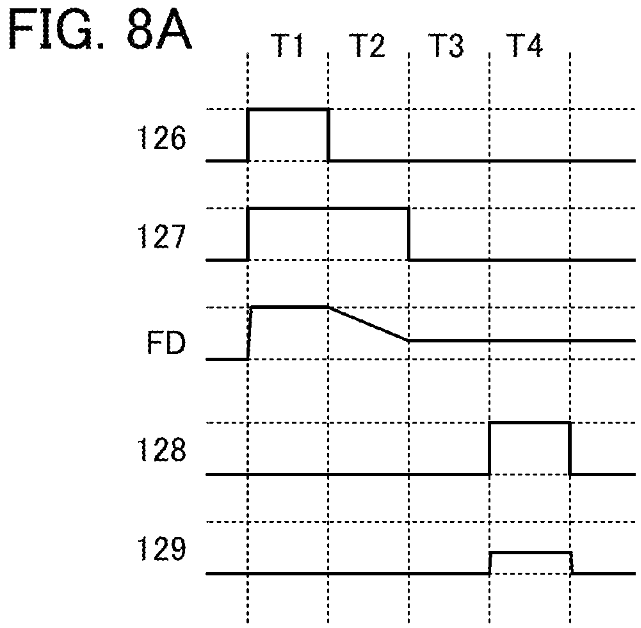
FIG. 8A and FIG. 8B are timing charts illustrating operations of the pixel circuits.

Next, an example of the operation of the pixel circuits 10 illustrated in FIG. 3A to FIG. 3C and FIG. 4A to FIG. 4C is described with reference to the timing chart of FIG. 8A. Note that in the description of the timing chart in this specification, a high potential is denoted by "H" and a low potential is denoted by "L". The wiring 121 is always supplied with "L", and the wiring 122 is always supplied with "H".

Note that the light-emitting device 11 is in a state of being supplied with a power supply potential for appropriately causing light emission at least in an accumulation operation period.

In a period T1, the potential of the wiring 126 is set to "H", the potential of the wiring 127 is set to "H", and the potential of the wiring 128 is set to "L", whereby the transistors 103 and 104 are turned on and the potential "H" of the wiring 122 is supplied to the node FD (reset operation).

In a period T2, the potential of the wiring 126 is set to "L", the potential of the wiring 127 is set to "H", and the potential of the wiring 128 is set to "L", whereby the transistor 104 is turned off, and supply of the reset potential is stopped. Furthermore, the potential of the node FD is decreased in accordance with the operation of the photoelectric conversion device 101 (accumulation operation).

In a period T3, the potential of the wiring 126 is set to "L", the potential of the wiring 127 is set to "L", and the potential of the wiring 128 is set to "L", whereby the transistor 103 is turned off, and the potential of the node FD is fixed and retained (retention operation). At this time, using OS transistors having a low off-state current as the transistor 103 and the transistor 104 connected to the node FD can suppress nonessential outflow of charge from the node FD and extend the data retention time.

In a period T4, the potential of the wiring 126 is set to "L", the potential of the wiring 127 is set to "L", and the potential of the wiring 128 is set to "H", whereby the transistor 106 is turned on, and the potential of the node FD is read out to the wiring 129 by source follower operation of the transistor 105 (reading operation).

The above is the example of the operation of the pixel circuits 10 illustrated in FIG. 3A to FIG. 3C and FIG. 4A to FIG. 4C.

Figure 8B:
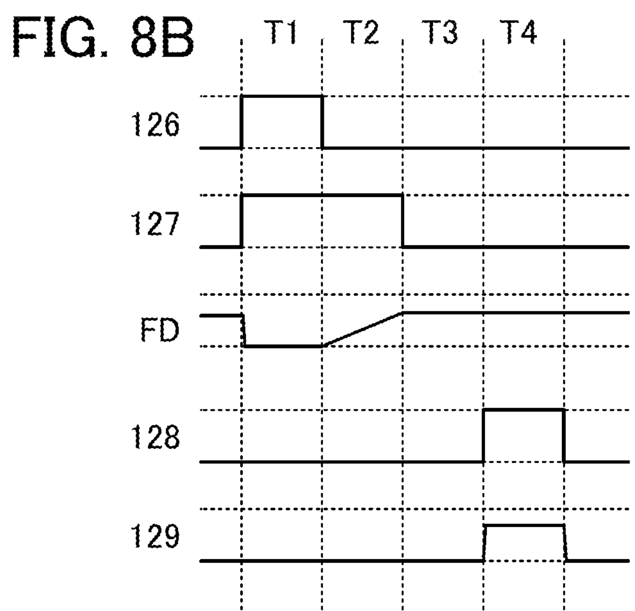

The pixel circuits 10 illustrated in FIG. 5A to FIG. 5C and FIG. 6A to FIG. 6C can be operated in accordance with the timing chart of FIG. 8B. Note that the wiring 122 is always supplied with "H", and the wiring 132 is always supplied with "L". The fundamental operation is similar to that described above with the timing chart of FIG. 8A.

Figure 9A:
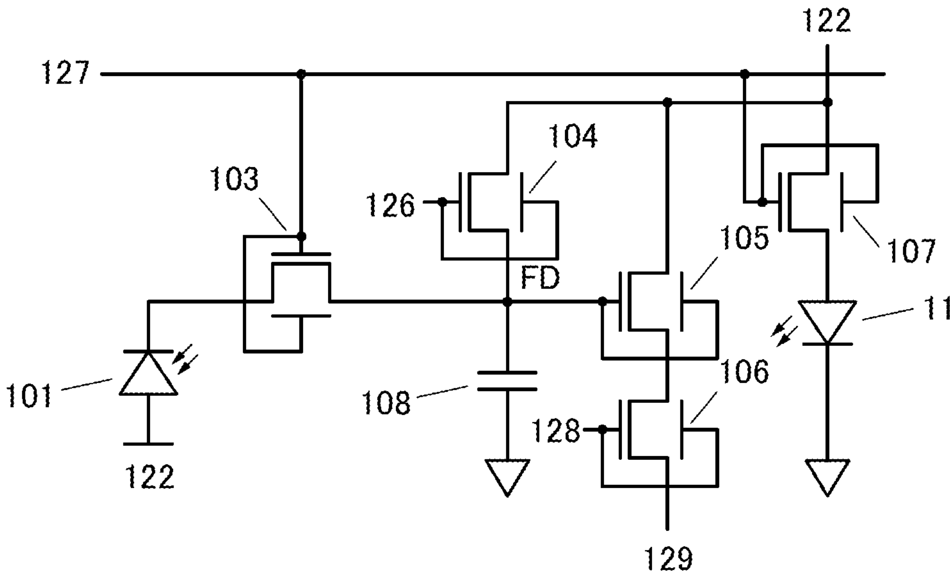
FIG. 9A and FIG. 9B are views illustrating pixel circuits.
Figure 9B:
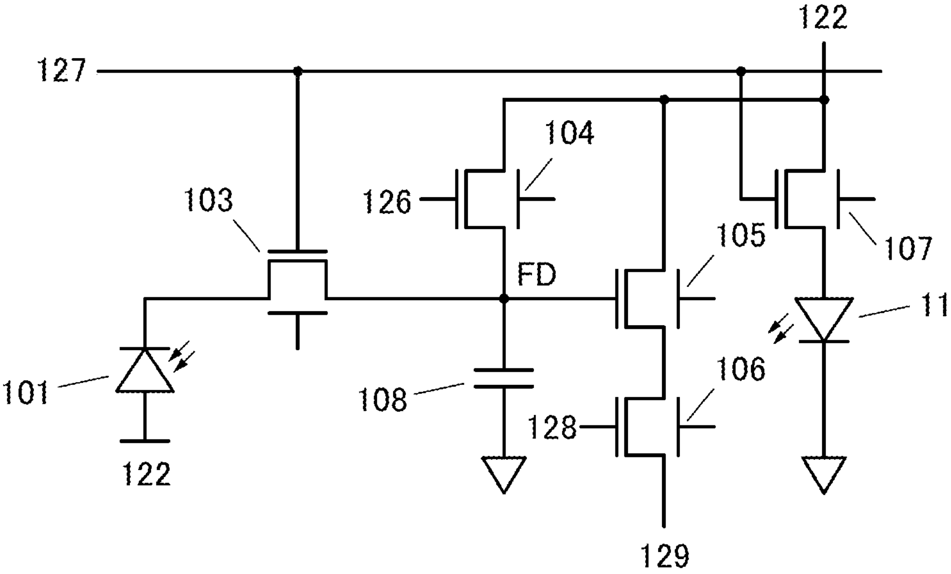

In one embodiment of the present invention, as illustrated in examples of FIG. 9A and FIG. 9B, a structure in which transistors are provided with backgates may be employed. FIG. 9A illustrates a structure in which the backgates are electrically connected to the front gates, which has an effect of increasing the on-state current. FIG. 9B illustrates a structure in which the backgates are each electrically connected to a wiring capable of supplying a constant potential, which enables the threshold voltage of the transistors to be controlled.

Moreover, a structure which enables each transistor to perform appropriate operation, for example, a combined structure of FIG. 9A and FIG. 9B, may be employed. The pixel circuit may include a transistor not provided with a backgate. Note that the structure of a transistor provided with a backgate can be applied to all the structures illustrated in FIG. 3A to FIG. 3C, FIG. 4A to FIG. 4C, FIG. 5A to FIG. 5C, and FIG. 6A to FIG. 6C.

This embodiment can be combined with the other embodiments as appropriate.

Embodiment 2

In this embodiment, structure examples and the like of the imaging device of one embodiment of the present invention are described.

Figures 10A, 10B, 10C, 10D:
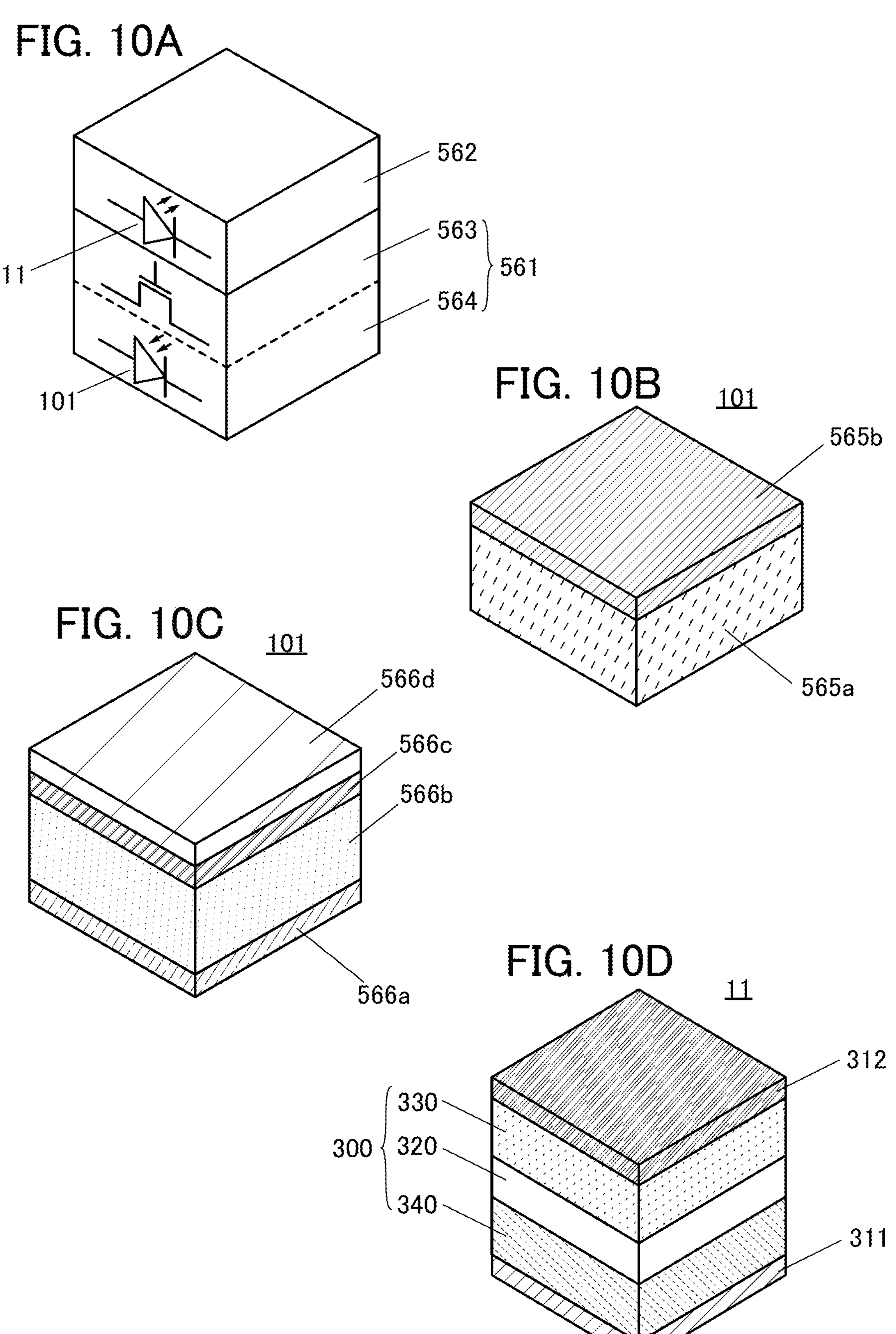
FIG. 10A is a view illustrating a structure of a pixel of an imaging device.
FIG. 10B and FIG. 10C are views illustrating structures of a photoelectric conversion device.
FIG. 10D is a view illustrating a structure of a light-emitting device.

FIG. 10A illustrates a structure example of a pixel included in the imaging device. The pixel can have a layered structure of a layer 561 including the pixel circuit 10 and a layer 562 including the light-emitting device 11.

The layer 561 includes a layer 563 and a layer 564. Components such as the transistors included in the pixel circuit 10 are mainly provided in the layer 563. Furthermore, the photoelectric conversion device 101 is mainly provided in the layer 564. The photoelectric conversion device 101 can be a stacked layer of a layer 565*a* and a layer 565*b* as illustrated in FIG. 10B.

The photoelectric conversion device 101 illustrated in FIG. 10B is a pn-junction photodiode; for example, a p-type semiconductor can be used for the layer 565*a*, and an n-type semiconductor can be used for the layer 565*b*. Alternatively, an n-type semiconductor may be used for the layer 565*a*, and a p-type semiconductor may be used for the layer 565*b*.

Alternatively, as illustrated in FIG. 10C, the photoelectric conversion device 101 may be a pin-junction photodiode. For example, a p-type semiconductor, an i-type semiconductor, an n-type semiconductor, and a light-transmitting conductive film can be used for a layer 566*a*, a layer 566*b*, a layer 566*c*, and a layer 566*d*, respectively. Alternatively, an n-type semiconductor may be used for the layer 566*a*, and a p-type semiconductor may be used for the layer 566*c*.

The pn-junction photodiode can be formed using single crystal silicon. The pin-junction photodiode can also be formed using a thin film of single crystal silicon, microcrystalline silicon, polycrystalline silicon, or the like. Single crystal silicon, microcrystalline silicon, and polycrystalline silicon have infrared light sensitivity and is suitable for sensing of infrared light.

For the layer 564 illustrated in FIG. 10A, a silicon substrate can be used, for example. The silicon substrate can include a Si transistor or the like, as well as the pn-junction photodiode. With the use of the Si transistor, a circuit for driving the pixel circuit, a circuit for reading out an image signal, an image processing circuit, or the like can be provided. Specifically, some or all of the transistors included in the peripheral circuits (the pixel circuit 10, the circuits 22, 23, and 28, and the like) described in Embodiment 1 can be provided in the layer 564.

Alternatively, the layer 564 may have a structure including a support which has an insulating surface, such as a glass substrate, and the above-described pin-junction photodiode.

The layer 563 can include an OS transistor (for example, part or whole of the transistors 103, 104, 105, 106, and 107 included in the pixel circuit 10). Furthermore, some of the transistors included in the peripheral circuits described in Embodiment 1 may be included as well.

With such a structure, components of the pixel circuit and the peripheral circuits can be distributed in a plurality of layers and the components can be provided to overlap with each other or the components and the peripheral circuits can be provided to overlap with each other, whereby the area of the imaging device can be reduced.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium; for example, a C-Axis Aligned Crystalline Oxide Semiconductor (CAAC-OS) or a Cloud-Aligned Composite Oxide Semiconductor (CAC-OS), each of which will be described later, or the like can be used. A CAAC-OS has a crystal structure including stable atoms and is suitable for a transistor that is required to have high reliability, and the like. A CAC-OS has high mobility and is suitable for a transistor that operates at high speed, and the like.

In the OS transistor, a semiconductor layer has a large energy gap, and thus the OS transistor has an extremely low off-state current of several yoctoamperes per micrometer (current per micrometer of a channel width). The OS transistor has the following feature different from that of a Si transistor: impact ionization, an avalanche breakdown, a short-channel effect, or the like does not occur, and thus can configure a circuit having a high withstand voltage and high reliability. Moreover, variations in electrical characteristics due to crystallinity unevenness, which are caused in the Si transistor, are less likely to occur in the OS transistor.

The semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be typically formed by a sputtering method. Alternatively, the In-M-Zn-based oxide may be formed by an ALD (Atomic layer deposition) method.

The atomic ratio of metal elements of a sputtering target used for forming the In-M-Zn oxide by a sputtering method preferably satisfies In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratios of metal elements of the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and an oxide semiconductor having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry (SIMS)) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by SIMS) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by SIMS) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element Min a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using the CAC-OS has high reliability. Thus, the CAC-OS is suitably used as a constituent material of a variety of semiconductor devices.

The layer 562 includes the light-emitting device 11. As the light-emitting device 11, a light-emitting device (EL element) that utilizes electroluminescence can be used. An EL element includes a layer containing a light-emitting compound (EL layer) between a pair of electrodes. By generating a potential difference between the pair of electrodes that is greater than the threshold voltage of the EL element, holes are injected into the EL layer from the anode side and electrons are injected into the EL layer from the cathode side. The injected electrons and holes are recombined in the EL layer and the light-emitting substance contained in the EL layer emits light.

As the EL element, an organic EL element or an inorganic EL element can be used, for example. Note that an LED (including a mini LED and a micro LED) that uses a compound semiconductor as a light-emitting material can also be used.

In an organic EL element, voltage application causes electrons to be injected from one electrode to the EL layer and holes to be injected from the other electrode to the EL layer. Then, the carriers (electrons and holes) recombine, so that the light-emitting organic compound forms an excited state, and light is emitted when the excited state returns to a ground state. Owing to such a mechanism, this light-emitting device is referred to as a current-excitation light-emitting device.

The EL layer can be formed by a method such as an evaporation method (including a vacuum evaporation method), a transfer method, a printing method, an inkjet method, or a coating method.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions.

FIG. 10D illustrates a structure of the light-emitting device 11. An EL layer 300 can include a plurality of layers such as a layer 330, a light-emitting layer 320, and a layer 340. The layer 330 can include a layer containing a substance having a high electron-injection property (an electron-injection layer), a layer containing a substance having a high electron-transport property (an electron-transport layer), and the like, for example. The light-emitting layer 320 contains a light-emitting compound, for example. The layer 340 can include a layer containing a substance having a high hole-injection property (a hole-injection layer) and a layer containing a substance having a high hole-transport property (a hole-transport layer), for example.

The EL layer 300 provided between an electrode 311 and an electrode 312 can function as a single light-emitting unit. Note that a plurality of light-emitting layers may be provided between the layer 330 and the layer 340. Note that a light-transmitting conductive film is used as either of the electrode 311 and the electrode 312, whereby the light emission direction is determined.

The light-emitting device 11 can emit light of various wavelengths depending on the material of the EL layer 300. In one embodiment of the present invention, a material that emits light having a peak in the near-infrared light (wavelengths from 720 nm to 2500 nm) is used as a material of the EL layer 300. For example, materials that emit light of 720 nm, 760 nm, 850 nm, 900 nm, and the vicinities of these wavelengths may be used in accordance with the uses.

Note that in one embodiment of the present invention, it is preferable that the EL layer 300 include an organometallic iridium complex that emits near-infrared light as the light-emitting material (also referred to as a guest material or a dopant material). The organometallic iridium complex preferably includes a dimethylphenyl skeleton and a quinoxaline skeleton. Furthermore, as the organometallic iridium complex, bis{4,6-dimethyl-2-[3-(3,5-dimethylphenyl)-2-quinoxalinyl-κN]phenyl-κC}(2,2',6,6'-tetramethyl-3,5-heptanedionato-κO,O')iridium(III) (abbreviation: $Ir(dmdpq)_2(dpm)$) or the like can be typically used. With the use of the above-described organometallic iridium complex, it is possible to provide an imaging element with high quantum efficiency or high emission efficiency.

As the substance (i.e., a host material) used for dispersing the organometallic iridium complex, it is preferable to use a compound having an arylamine skeleton such as 2,3-bis(4-diphenylaminophenyl)quinoxaline (abbreviation: TPAQn) or 4,4'-bis[N-(1-naphthyl)-N-phenylamino]biphenyl (abbreviation: NPB), a carbazole derivative such as 4,4'-di(N-carbazolyl)biphenyl (abbreviation: CBP) or 4,4',4"-tris(carbazol-9-yl)triphenylamine (abbreviation: TCTA), or a metal complex such as bis[2-(2-hydroxyphenyl)pyridinato]zinc (abbreviation: Znpp2), bis[2-(2-hydroxyphenyl)benzoxazolato]zinc (abbreviation: $Zn(BOX)_2$), bis(2-methyl-8-quinolinolato)(4-phenyphenolato)aluminum (abbreviation: BAlq)

or tris(8-quinolinolato)aluminum (abbreviation: $Alq_3$), for example. Moreover, a high molecular compound such as poly(N-vinylcarbazole) (abbreviation: PVK) can also be used.

As the material (host material) used for dispersing the organometallic iridium complex, N-(1,1'-biphenyl-4-yl)-N-[4-(9-phenyl-9H-carbazol-3-yl)phenyl]-9,9-dimethyl-9H-fluoren-2-amine (abbreviation: PCBBiF) is suitably used.

Note that when the light-emitting layer 320 is formed so as to contain the above-described organometallic iridium complex (guest material) and the above-described host material, near-infrared phosphorescence can be obtained from the EL layer 300 with high emission efficiency.

Figure 11A:
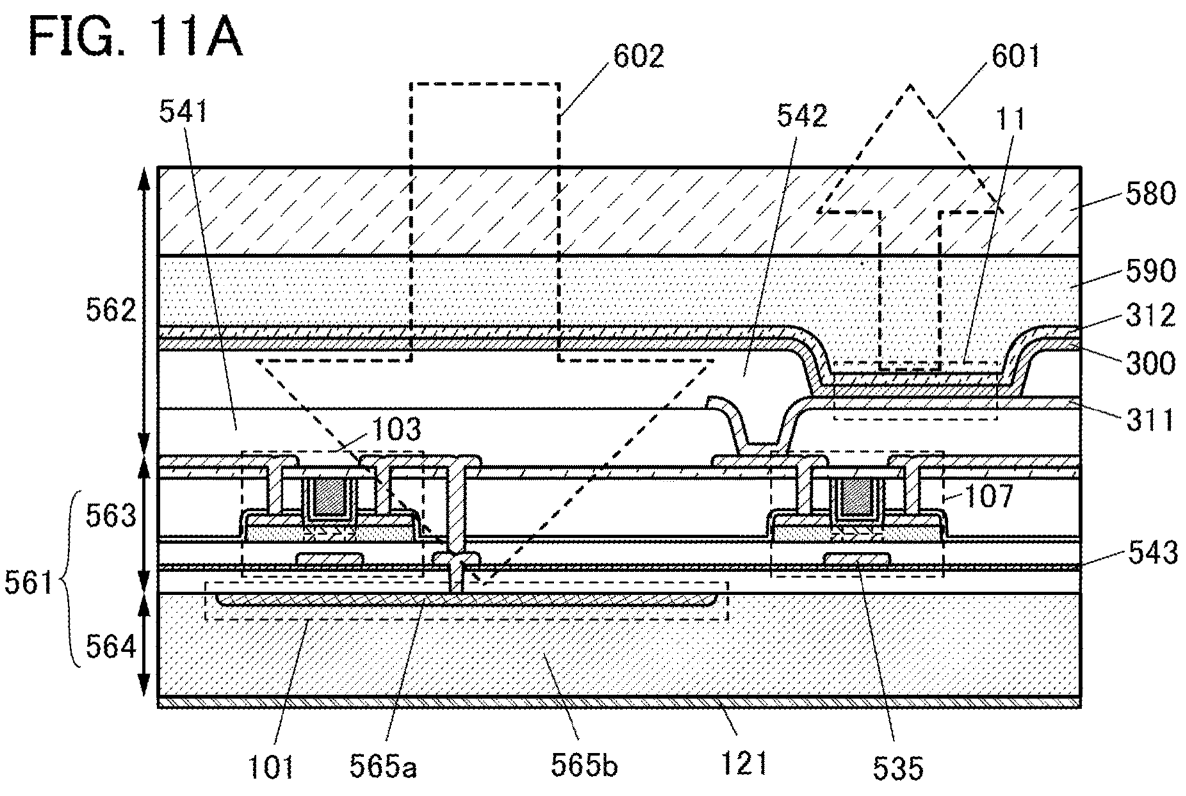
FIG. 11A and FIG. 11B are views illustrating structures of a pixel of an imaging device.

FIG. 11A is a view illustrating an example of a cross section of the pixel illustrated in FIG. 10A. The layer 564 includes the pn-junction photodiode illustrated in FIG. 10B as the photoelectric conversion device 101. The layer 563 includes OS transistors. Taking the structure illustrated in FIG. 3C as an example, the transistors 103 and 107 are illustrated in FIG. 11A.

In the photoelectric conversion device 101, the layer 565*a* can be a p-type region, and the layer 565*b* can be an n-type region. Furthermore, the wiring 121 having a function of a power supply line is connected to the layer 565*b*.

The details of an OS transistor are illustrated in FIG. 12A. The OS transistor illustrated in FIG. 12A has a self-aligned structure in which a source electrode 205 and a drain electrode 206 are formed through provision of an insulating layer over a stacked layer of an oxide semiconductor layer and a conductive layer and provision of openings reaching the semiconductor layer.

The OS transistor can have a structure including a gate electrode 201 and a gate insulating film 202 in addition to a channel formation region, a source region 203, and a drain region 204, which are formed in the oxide semiconductor layer 207. At least the gate insulating film 202 and the gate electrode 201 are provided in the opening. An oxide semiconductor layer 208 may further be provided in the opening.

As illustrated in FIG. 12B, the OS transistor may have a self-aligned structure in which the source region 203 and the drain region 204 are formed in a semiconductor layer with the gate electrode 201 as a mask.

As illustrated in FIG. 12C, the OS transistor may be a non-self-aligned top-gate transistor including a region where the source electrode 205 or the drain electrode 206 overlaps with the gate electrode 201.

Although the transistors 103 and 107 each have a structure including a backgate 535, they may have a structure not including a backgate. As illustrated in the cross-sectional view of the transistor in the channel width direction in FIG. 12D, the backgate 535 may be electrically connected to a front gate of the transistor, which is provided to face the backgate. Note that FIG. 12D illustrates the transistor of FIG. 12A as an example; however, the same applies to the transistors having the other structures. The backgate 535 may be supplied with a fixed potential that is different from that supplied to the front gate.

An insulating layer 543 that has a function of inhibiting diffusion of hydrogen is provided between a region where OS transistors are formed and a region where a Si device such as the photoelectric conversion device 101 is formed. Hydrogen in the insulating layer provided in the vicinity of the photoelectric conversion device 101 terminates dangling bonds of silicon. Meanwhile, hydrogen in the insulating layer provided in the vicinity of the channel formation regions of the transistors 103 and 107 is a factor of generating carriers in the oxide semiconductor layer.

Hydrogen is confined in one layer with the use of the insulating layer 543, whereby the reliability of the Si device can be improved. Furthermore, diffusion of hydrogen from one layer to the other layer is inhibited, so that the reliability of the OS transistors (the transistors 103 and 107) can also be improved.

For the insulating layer 543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used, for example.

Over the transistors 103 and 107, planarization films 541 and 542 are provided. The light-emitting device 11 (the electrode 311, the EL layer 300, and the electrode 312) is provided over planar surfaces which are obtained owing to the planarization films 541 and 542 covering uneven portions generated at the transistors or the contact portion.

A low-resistance conductive film such as a metal can be used for the electrode 311. For example, the electrode 311 can be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; or metal nitrides thereof.

As the electrode 312, a light-transmitting conductive film that transmits near-infrared light can be used. For the electrode 312, it is possible to use a conductive material with a light-transmitting property, such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added, for example.

Here, the EL layer 300 overlapping with the electrode 311 and the electrode 312 can emit light; however, the EL layer 300 which overlaps with the electrode 312 but does not overlap with the electrode 311 cannot emit light. Furthermore, the EL layer 300 is an extremely thin film and can ignore absorption of near-infrared light. Accordingly, the EL layer 300 and the electrode 312 can be provided so as to overlap with the photoelectric conversion device 101.

Although FIG. 11A illustrates a region where the photoelectric conversion device 101 and the transistor 103 overlap with each other, the region is a part of the whole light-receiving portion and does not significantly decrease the light reception ability. Note that a structure which does not include a region where the photoelectric conversion device 101 and the transistor 103 overlap with each other may be employed as well.

In the structure of the pixel illustrated in FIG. 11A, the light-emitting device 11 included in the layer 562 emits light 601 to the outside, and reflected light 602 having passed through the layer 562 and the layer 563 is received by the photoelectric conversion device 101 included in the layer 564.

A sealing layer 590 is preferably provided between the light-emitting device 11 and a substrate 580 to seal the light-emitting device 11 and avoid entry of oxygen, hydrogen, moisture, carbon dioxide, and the like into the light-emitting device 11. As the sealing layer 590, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may also be contained in the sealing layer 590.

Moreover, as a part of the sealing layer, a protective layer of silicon nitride, silicon nitride oxide, aluminum oxide, aluminum nitride, aluminum oxynitride, aluminum nitride oxide, DLC (Diamond Like Carbon), or the like may be provided.

Figure 11B:
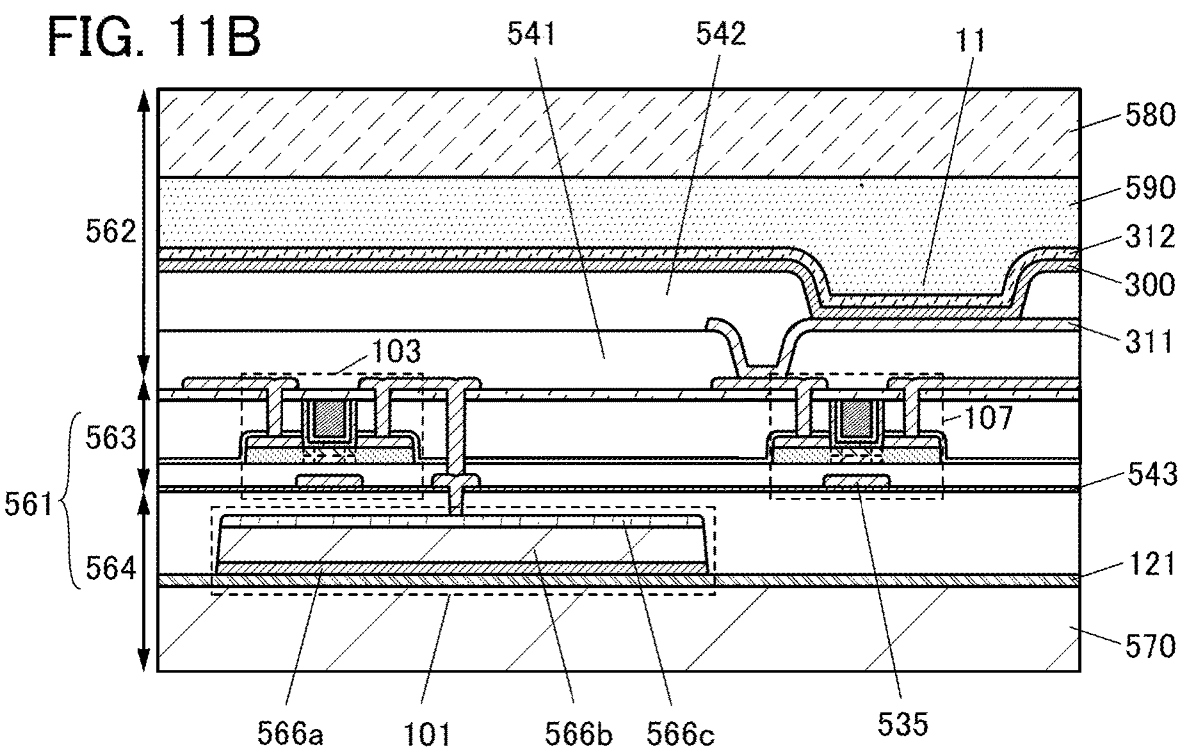

FIG. 11B illustrates an example of a cross section of a pixel of the case where the pin-junction photodiode illustrated in FIG. 10C is used as the photoelectric conversion device 101. In the photoelectric conversion device 101, the layer 566*a* can be a p-type region, the layer 566*b* can be an i-type region, and the layer 566*c* can be an n-type region. Furthermore, the wiring 121 having a function of a power supply line is connected to the layer 566*a*.

The photoelectric conversion device 101 and the wiring 121 are provided over a substrate 570. As the substrate 570, a substrate having an insulating surface, such as a glass substrate, a ceramic substrate, or a resin substrate, can be used. Note that a metal substrate or a semiconductor substrate may also be used as long as insulation treatment has been performed on the surface.

Hereinafter, a package in which an image sensor chip is placed will be described. For the image sensor chip, the structure of the above-described imaging device with a light source can be used.

Figure 13A:
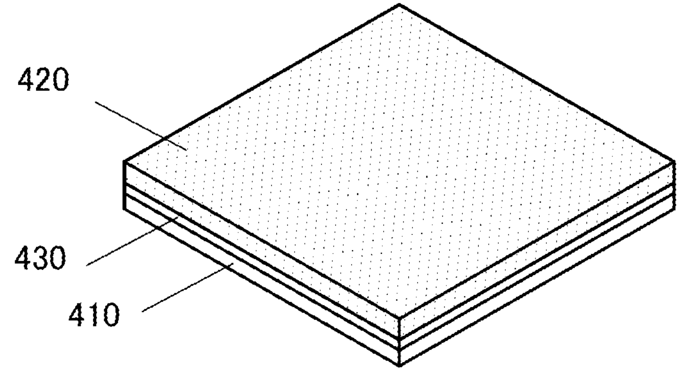
FIG. 13A, FIG. 13B, and FIG. 13C are perspective views of a package in which an imaging device is placed.

FIG. 13A is an external perspective view of the top surface side of a package in which an image sensor chip is placed. The package includes a package substrate 410 to which an image sensor chip 450 is fixed, a cover glass 420, an adhesive 430 for bonding the package substrate 410 and the cover glass 420, and the like.

Figure 13B:
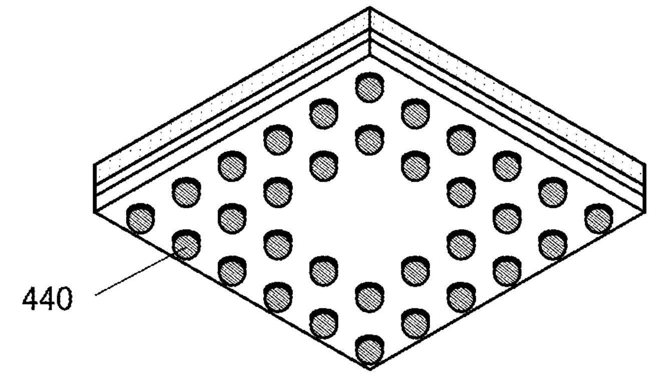

FIG. 13B is an external perspective view of the bottom surface side of the package. A BGA (ball grid array) in which solder balls are used as bumps 440 is included on the bottom surface of the package. Note that, without limitation to the BGA, an LGA (land grid array), a PGA (pin grid array), or the like may be included.

Figure 13C:
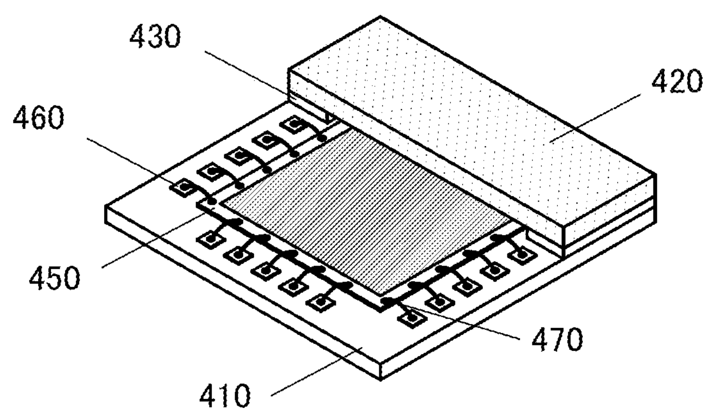

FIG. 13C is a perspective view of the package, in which parts of the cover glass 420 and the adhesive 430 are not illustrated. Electrode pads 460 are formed over the package substrate 410, and the electrode pads 460 and the bumps 440 are electrically connected to each other via through holes. The electrode pads 460 are electrically connected to the image sensor chip 450 through wires 470.

The image sensor chip placed in a package like the one having the above-described form can be easily mounted on a printed substrate or the like, and the image sensor chip can be incorporated into a variety of electronic devices.

This embodiment can be combined with the other embodiments as appropriate.

Embodiment 3

In this embodiment, examples of electronic devices in which an imaging device of one embodiment of the present invention can be used will be described.

Figure 14A:
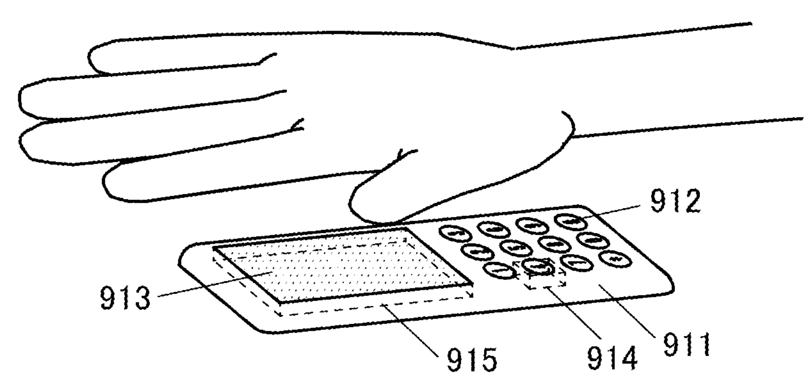
FIG. 14A, FIG. 14B, and FIG. 14C are views illustrating electronic devices.

FIG. 14A illustrates a biometric authentication device including a thin housing 911, an operation button 912, a sensing portion 913, and the like. By holding the hand or finger over the sensing portion 913 or touching the sensing portion 913 with the hand or finger, the shape of the vein can be identified. A wireless communication unit 914 transmits the obtained data to a server, and the data is compared with a database; thus, personal identification is possible. Furthermore, a security code or the like can be input with the operation button. An imaging device 915 of one embodiment of the present invention is placed right below the sensing portion; therefore, another light source is unnecessary and a thin identification device can be formed. The small thickness facilitates the incorporation into various devices. In addition, the portability is also increased.

Figure 14B:
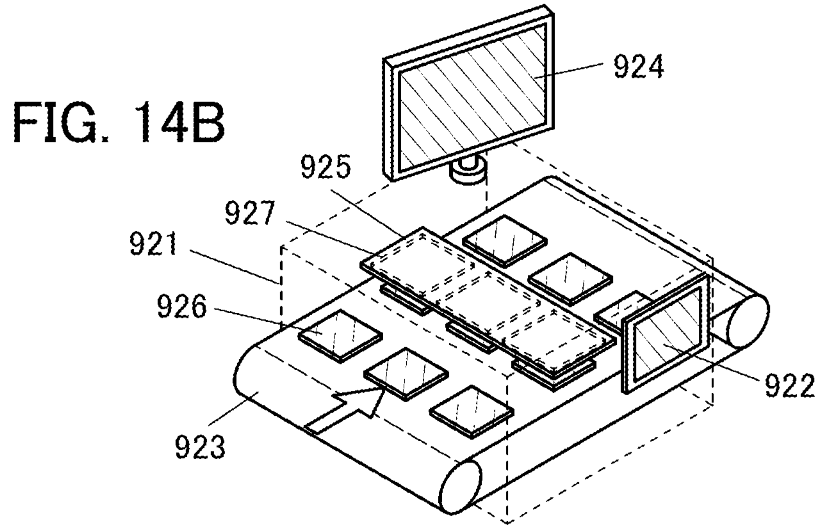

FIG. 14B illustrates a non-destructive testing device including a housing 921, an operation panel 922, a transfer mechanism 923, a monitor 924, a sensing unit 925, and the like. Testing target members 926 are transported to the position directly under the sensing unit 925 by the transfer mechanism 923. An imaging device 927 of one embodiment of the present invention provided in the sensing unit 925 performs image capturing on the testing target members 926, and the captured image is displayed on the monitor 924. After that, the testing target members 926 are transported to an exit of the housing 921 and a defective member is separately collected. Image capturing using near-infrared light enables non-destructive and high-speed sensing of defective elements inside the testing target members, such as defects and foreign bodies. Since the imaging device 915 of one embodiment of the present invention does not need an additional light source, the sensing unit 925 can be formed at low costs.

Figure 14C:
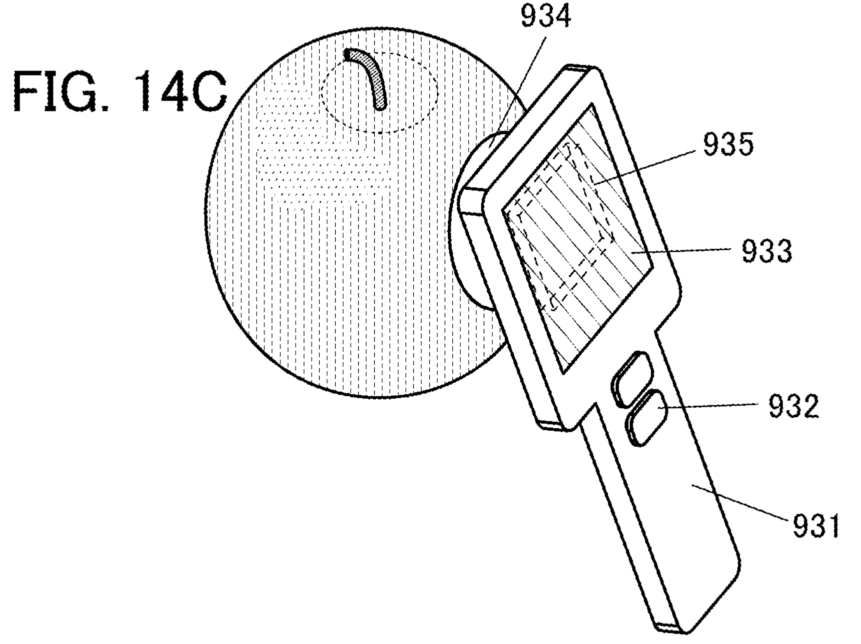

FIG. 14C illustrates a food screening device including a housing 931, an operation button 932, a display portion 933, a light-blocking hood 934, and the like. The light-blocking hood 934 provided in the periphery of the light-receiving portion is brought into intimate contact with a food of the inspection target, such as a fruit, and image capturing is performed; thus, a foreign body mixed into the food, a bug, a cavity or spoilage inside the food, and the like can be detected. Furthermore, the sugar content, moisture content, or the like of foods can also be determined from the intensity of the detected near-infrared light. The food screening device can sort out defectives, classify foods according to the grade, and determine the harvest time. An imaging device 935 of one embodiment of the present invention provided in the light receiving portion does not need an additional light source; therefore, a thin, lightweight, and highly portable food screening device can be formed at low costs. Note that the structure illustrated in FIG. 14B may be used for the food screening device. Alternatively, the structure illustrated in FIG. 14C may be used for a non-destructive testing device.

This embodiment can be combined with the other embodiments as appropriate.

REFERENCE NUMERALS

10: pixel circuit, 11: light-emitting device, 21: pixel array, 22: circuit, 23: circuit, 24: circuit, 25: circuit, 26: circuit, 28: circuit, 101: photoelectric conversion device, 103: transistor, 104: transistor, 105: transistor, 106: transistor, 107: transistor, 108: capacitor, 109: resistor, 121: wiring, 122: wiring, 126: wiring, 127: wiring, 128: wiring, 129: wiring, 130: wiring, 131: wiring, 132: wiring, 201: gate electrode, 202: gate insulating film, 203: source region, 204: drain region, 205: source electrode, 206: drain electrode, 207: oxide semiconductor layer, 208: oxide semiconductor layer, 300: EL layer, 311: electrode, 312: electrode, 320: light-emitting layer, 330: layer, 340: layer, 410: package substrate, 420: cover glass, 430: adhesive, 440: bump, 450: image sensor chip, 460: electrode pad, 470: wire, 535: backgate, 541: planarization film, 542: planarization film, 543: insulating layer, 561: layer, 562: layer, 563: layer, 564: layer, 565*a*: layer, 565*b*: layer, 566*a*: layer, 566*b*: layer, 566*c*: layer, 570: substrate, 580: substrate, 590: sealing layer, 601: light, 602: reflected light, 911: housing, 912: operation button, 913: sensing portion, 914: wireless communication unit, 915:

imaging device, 921: housing, 922: operation panel, 923: transfer mechanism, 924: monitor, 925: sensing unit, 926: testing target members, 927: imaging device, 931: housing, 932: operation button, 933: display portion, 934: light-blocking hood, 935: imaging device This application is based on Japanese Patent Application Serial No. 2018-167669 filed with Japan Patent Office on Sep. 7, 2018, the entire contents of which are hereby incorporated herein by reference.

The invention claimed is:

1. An imaging device comprising:
a pixel circuit; and
a light-emitting device,
the pixel circuit comprising:
a photoelectric conversion device comprising a photoelectric conversion layer; and
a transistor comprising a gate electrode,
the light-emitting device comprising:
a first electrode;
a second electrode; and
a light-emitting layer,
wherein the light-emitting layer is provided between the first electrode and the second electrode,
wherein the photoelectric conversion device comprises a region which does not overlap with the first electrode, and
wherein the gate electrode is directly above the photoelectric conversion device and under the second electrode, the gate electrode overlapping with both the photoelectric conversion device and the second electrode.

2. The imaging device according to claim 1, wherein the photoelectric conversion device comprises a region overlapping with the second electrode and the light-emitting layer.

3. The imaging device according to claim 1, wherein the light-emitting device emits infrared light.

4. The imaging device according to claim 1, wherein the second electrode is formed of a light-transmitting conductive film having a property of transmitting infrared light.

5. The imaging device according to claim 1, wherein at least one transistor included in the imaging device includes a metal oxide in its channel formation region, and the metal oxide includes In, Zn, and M (Mis Al, Ti, Ga, Sn, Y, Zr, La, Ce, Nd, or Hf).

6. An electronic device comprising the imaging device according to claim 1, and a display device.

7. An imaging device comprising:
a pixel circuit; and
a light-emitting device,
the light-emitting device comprising:
a first electrode;
a second electrode; and
a light-emitting layer,
wherein the light-emitting layer is provided between the first electrode and the second electrode,
the pixel circuit comprising:
a photoelectric conversion device comprising a photoelectric conversion layer; and
a first transistor over an insulating surface,
wherein one electrode of the photoelectric conversion device is electrically connected to one of a source and a drain of the first transistor,
wherein a gate electrode of the first transistor is positioned over and overlapping with the photoelectric conversion device in a first direction perpendicular to the insulating surface,
wherein the second electrode is positioned over and overlapping with the gate electrode of the first transistor in the first direction, and
wherein the photoelectric conversion device comprises a region which does not overlap with the first electrode in the first direction.

8. The imaging device according to claim 7, wherein the photoelectric conversion device comprises a region overlapping with the second electrode and the light-emitting layer in the first direction.

9. The imaging device according to claim 7, wherein the light-emitting device emits infrared light.

10. The imaging device according to claim 7, wherein the second electrode is formed of a light-transmitting conductive film having a property of transmitting infrared light.

11. The imaging device according to claim 7, wherein at least one transistor included in the imaging device includes a metal oxide in its channel formation region, and the metal oxide includes In, Zn, and M (Mis Al, Ti, Ga, Sn, Y, Zr, La, Ce, Nd, or Hf).

12. An electronic device comprising the imaging device according to claim 7, and a display device.

13. An imaging device comprising:
a pixel circuit; and
a light-emitting device,
the light-emitting device comprising:
a first electrode;
a second electrode; and
a light-emitting layer,
wherein the light-emitting layer is provided between the first electrode and the second electrode,
wherein the light-emitting device emits light to an upper side,
the pixel circuit comprising:
a photoelectric conversion device comprising a photoelectric conversion layer; and
a first transistor over an insulating surface,
wherein one electrode of the photoelectric conversion device is electrically connected to one of a source and a drain of the first transistor,
wherein a gate electrode of the first transistor is positioned over and overlapping with the photoelectric conversion device in a first direction perpendicular to the insulating surface,
wherein the second electrode is positioned over and overlapping with the gate electrode of the first transistor in the first direction, and
wherein the photoelectric conversion device comprises a region which does not overlap with the first electrode in the first direction.

14. The imaging device according to claim 13, wherein the photoelectric conversion device comprises a region overlapping with the second electrode and the light-emitting layer in the first direction.

15. The imaging device according to claim 13, wherein the light-emitting device emits infrared light.

16. The imaging device according to claim 13, wherein the second electrode is formed of a light-transmitting conductive film having a property of transmitting infrared light.

17. The imaging device according to claim 13, wherein at least one transistor included in the imaging device includes a metal oxide in its channel formation region, and the metal oxide includes In, Zn, and M (Mis Al, Ti, Ga, Sn, Y, Zr, La, Ce, Nd, or Hf).

18. An electronic device comprising the imaging device according to claim 13, and a display device.

* * * * *